(12) United States Patent
Moriyama et al.

(10) Patent No.: US 12,080,452 B2
(45) Date of Patent: Sep. 3, 2024

(54) SHUNT RESISTOR

(71) Applicant: SUNCALL CORPORATION, Kyoto (JP)

(72) Inventors: Yuu Moriyama, Kyoto (JP); Kenji Murakami, Kyoto (JP); Akio Mugishima, Kyoto (JP)

(73) Assignee: SUNCALL CORPORATION, Kyoto (JP)

( * ) Notice: Subject to any disclaimer, the term of this patent is extended or adjusted under 35 U.S.C. 154(b) by 205 days.

(21) Appl. No.: 17/730,543

(22) Filed: Apr. 27, 2022

(65) Prior Publication Data

US 2022/0254551 A1 Aug. 11, 2022

Related U.S. Application Data

(63) Continuation of application No. PCT/JP2019/045079, filed on Nov. 18, 2019.

(51) Int. Cl.
| | |
|---|---|
| *H01C 1/148* | (2006.01) |
| *G01R 1/20* | (2006.01) |
| *H01C 1/14* | (2006.01) |
| *H01C 1/144* | (2006.01) |

(52) U.S. Cl.
CPC ............ *H01C 1/148* (2013.01); *G01R 1/203* (2013.01); *H01C 1/1406* (2013.01); *H01C 1/144* (2013.01)

(58) Field of Classification Search
CPC ...... H01C 1/148; H01C 1/1406; H01C 1/144; G01R 1/203
See application file for complete search history.

(56) References Cited

U.S. PATENT DOCUMENTS

| | | | | |
|---|---|---|---|---|
| 5,214,407 A | * | 5/1993 | McKim, Jr. ............ | H01C 17/24 338/195 |
| 7,911,319 B2 | * | 3/2011 | Smith ..................... | G01R 1/203 29/610.1 |
| 10,163,553 B2 | * | 12/2018 | Kameko ................ | H01C 17/28 |
| 10,438,730 B2 | * | 10/2019 | Kao ....................... | G01R 1/203 |
| 2018/0120359 A1 | * | 5/2018 | Nakamura ............. | H01C 1/14 |
| 2018/0174721 A1 | * | 6/2018 | Kameko ................ | H01C 13/00 |

FOREIGN PATENT DOCUMENTS

| | | |
|---|---|---|
| JP | 2011511472 A | 4/2011 |
| JP | 2013536424 A | 9/2013 |
| JP | 2018018915 A | 2/2018 |
| WO | 2017009419 A | 1/2017 |

* cited by examiner

*Primary Examiner* — Kyung S Lee
(74) *Attorney, Agent, or Firm* — Fritz L. Schweitzer, III; Farber LLC

(57) ABSTRACT

A shunt resistor having improved temperature characteristics has a resistive body, a pair of base materials integrally formed on the resistive body across the resistive body, and measurement terminals fixed onto the base materials. The base materials have a plurality of cutout portions along a longitudinal direction of the base materials, wherein the plurality of cutout portions do not communicate with each other and are provided in a stepped manner.

6 Claims, 4 Drawing Sheets

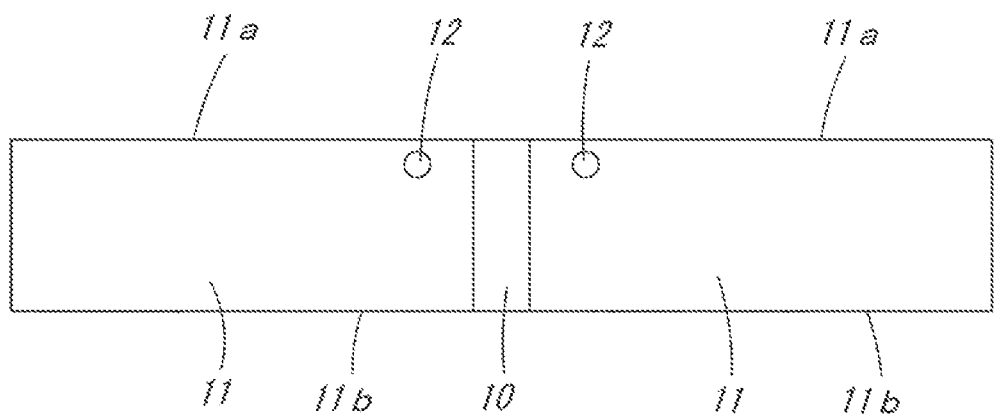
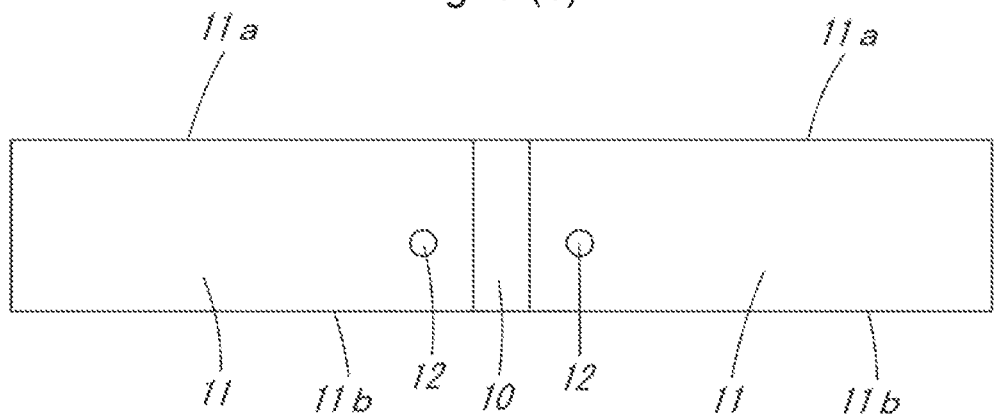

SHUNT RESISTOR

FIELD OF THE INVENTION

The present invention relates to a shunt resistor.

BACKGROUND OF THE INVENTION

A shunt resistor as described in Japanese Patent Application Publication No. 2017-009419 is known as a conventional shunt resistor. In this shunt resistor, a through hole is formed in each of two plate-like base materials integrally formed on a resistive body across the resistive body, and a current detection terminal having a first terminal portion inserted in the through hole and a second terminal portion protruding from the through hole is provided.

SUMMARY OF THE INVENTION

Incidentally, in the shunt resistor as described above, the temperature characteristics of combining the temperature characteristics of the resistive body and the temperature characteristics of the base materials are displayed. The temperature characteristics are one of the factors that affect the accuracy of the high-precision current sensor. Therefore, as a market demand, an improvement in temperature characteristics is required so that the absolute value of the temperature coefficient of resistance (TCR) is 50 ppm or less.

Accordingly, in view of the foregoing problem, an object of the present invention is to provide a shunt resistor capable of improving the temperature characteristics.

The foregoing object of the present invention is achieved by the following means. It is noted that reference signs in an embodiment to be described later are added in parentheses, but the present invention is not limited thereto.

According to the first aspect of the present invention, a shunt resistor (1) including a resistive body (10), a pair of base materials (11) integrally formed on the resistive body (10) across the resistive body (10), and measurement terminals (12) fixed on the base materials (11) is characterized in that the base materials (11) are each provided with a plurality of cutout portions (first cutout portion 13a, second cutout portion 13b) along a longitudinal direction of the base materials (11) and the plurality of cutout portions (first cutout portion 13a, second cutout portion 13b) do not communicate with each other and are provided in a stepped manner.

Further, according to the second aspect of the present invention, the shunt resistor according to the above first aspect is characterized in that, of the plurality of cutout portions (first cutout portion 13a, second cutout portion 13b), a cutout portion (second cutout portion 13b) located farthest from the resistive body (10) is formed so that a depth (D2) is the deepest as compared with a depth (D1) of the other cutout portion (first cutout portion 13a).

Further, according to the third aspect of the present invention, the shunt resistor according to the above second aspect is characterized in that, when fixed on the base materials (11), the measurement terminals (12) are each fixed so as to be located above a bottom portion (13b1) of the depth (D1) of the cutout portion (second cutout portion 13b) located farthest from the resistive body (10) and also further inside than one side portion (13a1) of a cutout portion (first cutout portion 13a) located closest to the resistive body (10).

Next, advantageous effects of the present invention will be described with reference signs in the drawings. It is noted that reference signs in an embodiment to be described later are added in parentheses, but the present invention is not limited thereto.

According to the first aspect of the present invention, the base materials (11) are each provided with the plurality of cutout portions (first cutout portion 13a, second cutout portion 13b) along the longitudinal direction of the base materials (11), and the plurality of cutout portions (first cutout portion 13a, second cutout portion 13b) do not communicate with each other and are provided in a stepped manner. This allows the absolute value of the temperature coefficient of resistance (TCR) to be 50 ppm or less, and as a result, the temperature characteristics can be improved.

Further, according to the second aspect of the present invention, of the plurality of cutout portions (first cutout portion 13a, second cutout portion 13b), the cutout portion (second cutout portion 13b) located farthest from the resistive body (10) is formed so that the depth (D2) is the deepest as compared with the depth (D1) of the other cutout portion (first cutout portion 13a). Therefore, the depth of the cutout portion can be adjusted so as not to affect the temperature characteristics of the resistive body 10, and as a result, the temperature characteristics can be improved.

Further, according to the third aspect of the present invention, the measurement terminals (12) are each fixed on the base material (11) so as to be located above the bottom portion (13b1) of the depth (D1) of the cutout portion (second cutout portion 13b) located farthest from the resistive body (10) and also further inside than one side portion (13a1) of the cutout portion (first cutout portion 13a) located closest to the resistive body (10). Therefore, it becomes easy to make the absolute value of the temperature coefficient of resistance (TCR) be 50 ppm or less, and as a result, the temperature characteristics can be easily improved.

BRIEF DESCRIPTION OF THE DRAWINGS

FIG. 3(a) is a plan view the shunt resistor according to the same embodiment in which first cutout portions and second cutout portions are not provided in base materials, view when the measurement terminals of the shunt resistor are provided on the upper surface side, and FIG. 3(b) is a plan view when the measurement terminals of the shunt resistor are provided on the lower surface side.

DETAILED DESCRIPTION OF THE INVENTION

Hereinafter, an embodiment of a shunt resistor according to the present invention will be specifically described with reference to the drawings. It is noted that, in the following description, when vertical and horizontal directions are indicated, it shall mean vertical and horizontal directions when viewed from the front of the figure.

Figure 1:
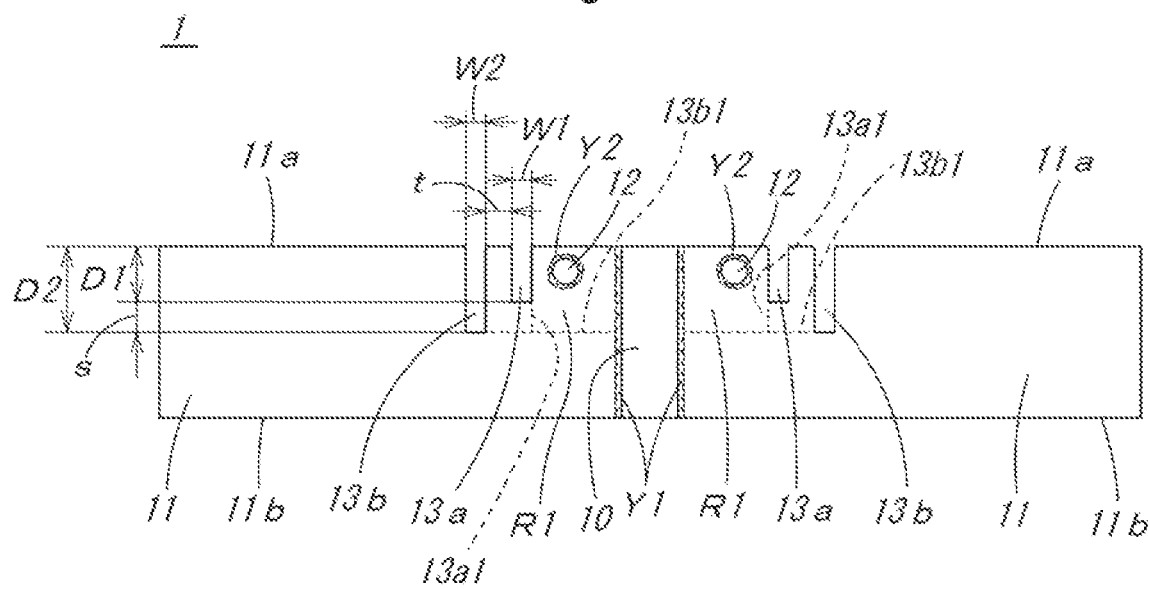
FIG. 1 is a plan view of a shunt resistor according to an embodiment of the present invention.

A shunt resistor according to the present embodiment is particularly used in measuring the current value of a current path through which a large current flows from a battery for high-voltage applications to a motor circuit that are used in, for example, electric vehicles (EVs), hybrid vehicles (HVs), and plug-in hybrid vehicles (PHVs). As shown in FIG. 1, the shunt resistor 1 is composed of a resistive body 10, two base materials 11 integrally formed with the resistive body 10 across the resistive body 10 by welding Y1, and measurement terminals 12 correspondingly erected and fixed by welding Y2 on the two base materials 11. The measurement terminal 12 is capable of mounting thereon a printed circuit board for current detection and is formed of, for example, copper or tin plating.

The resistive body 10 is formed of, for example, a Cu-Mn-based alloy, a Cu-Ni-based alloy, or a Ni-Cr-based alloy, and is one whose resistance value is about 30 µΩ to 50 µΩ so as to be able to handle a large current of 1000 A, for example. As shown in FIG. 1, the resistive body 10 is formed, for example, in a thick plate shape having a thickness of about 3 mm to 5 mm and in a short rectangular shape.

The base material 11 is a so-called bus bar, is formed of metal such as copper, and as shown in FIG. 1, is formed, for example, in a thick plate shape having a thickness of about 2 mm to 5 mm and in a long rectangular shape. As shown in FIG. 1, the base material 11 is provided with a first cutout portion 13a and a second cutout portion 13b along a longitudinal direction. The first cutout portion 13a is provided at a position close to the resistive body 10 and is formed by cutting out the base material 11 from an upper surface 11a toward a lower surface 11b of the base material 11 in a rectangular shape in plan view. The width W1 of the first cutout portion 13a thus formed is formed to be, for example, 2 mm and the depth D1 is formed to be, for example, 4 mm.

On the other hand, as shown in FIG. 1, the second cutout portion 13b is provided at a position farther from the resistive body 10 than the first cutout portion 13a and is formed by cutting out the base material 11 from the upper surface 11a toward the lower surface 11b of the base material 11 in a rectangular shape in plan view. The width W2 of the second cutout portion 13b thus formed is formed to be, for example, 2 mm and the depth D2 is formed to be, for example, 6 mm. Further, the second cutout portion 13b is formed at a position separated by a distance t (for example, 2 mm) so as not to communicate with the first cutout portion 13a. Further, the depth D2 of the second cutout portion 13b is formed so as to be deeper than the depth D1 of the first cutout portion 13a, that is, so as to have a height difference s (for example, 2 mm). Accordingly, the first cutout portion 13a and the second cutout portion 13b are formed in a stepped manner.

Incidentally, the first cutout portion 13a and the second cutout portion 13b are provided so that the absolute value of the temperature coefficient of resistance (TCR) is 50 ppm or less. That is, as described above, the temperature characteristics of combining the temperature characteristics of the resistive body 10 and the temperature characteristics of the base materials 11 are displayed in the shunt resistor 1. Thus, in the present embodiment, the first cutout portion 13a and the second cutout portion 13b as shown in FIG. 1 are provided in order to improve the temperature characteristics, that is, to make the absolute value of the temperature coefficient of resistance (TCR) be 50 ppm or less, which is required by the market.

More specifically, when the first cutout portion 13a and the second cutout portion 13b as shown in FIG. 1 are provided, first, only the first cutout portion 13a is provided in the base material 11 or the first cutout portion 13a and the second cutout portion 13b are provided in the base material 11 with the first cutout portion 13a and the second cutout portion 13b having about the same depth (for example, the depth of the first cutout portion 13a and the second cutout portion 13b is set to be the depth D1 shown in FIG. 1). In that state, the measurement terminal 12 is erected and fixed by welding Y2 onto the base material 11, and the temperature coefficient of resistance (TCR) is measured. Subsequently, based on the measurement result of the measured temperature coefficient of resistance (TCR), the second cutout portion 13b as shown in FIG. 1 is provided in the base material 11 so that the absolute value of the temperature coefficient of resistance (TCR) is 50 ppm or less, or the depth of the second cutout portion 13b, which is about the same as that of the first cutout portion 13a, is adjusted by further increasing the depth so that the absolute value of the temperature coefficient of resistance (TCR) is 50 ppm or less. As a result, the absolute value of the temperature coefficient of resistance (TCR) can be made to be 50 ppm or less.

Thus, by doing so, the absolute value of the temperature coefficient of resistance (TCR) can be made to be 50 ppm or less, and as a result, the temperature characteristics can be improved. At this time, it may be configured such that the depth of the first cutout portion 13a is adjusted so that the depth D1 of the first cutout portion 13a is deeper than the depth D2 of the second cutout portion 13b to generate a height difference s. However, it is preferable that the depth of the second cutout portion 13b is adjusted so that the depth D2 of the second cutout portion 13b is deeper than the depth D1 of the first cutout portion 13a to generate the height difference s. Since the temperature characteristics of the resistive body 10 also affects the temperature coefficient of resistance (TCR), it is likely to have some effect on the resistive body 10 when the depth of the first cutout portion 13a provided at the position close to the resistive body 10 is adjusted, and as a result, it may become difficult to make the absolute value of the temperature coefficient of resistance (TCR) be 50 ppm or less. Therefore, in order to avoid such a situation, it is preferable to adjust the depth of the second cutout portion 13b provided at the position farther from the resistive body 10 than the first cutout portion 13a.

Incidentally, as for the position of the measurement terminal 12 erected and fixed by welding Y2 on the base material 11, the measurement terminal 12 is preferably erected and fixed at a position of a region R1 shown in FIG. 1 so as to be affected by the first cutout portion 13a and the second cutout portion 13b provided in the base material 11. The region R1 indicates a region above a bottom portion 13b1 of the second cutout portion 13b and inside one side portion 13a1 (side surface located close to the resistive body 10) of the first cutout portion 13a. By erecting and fixing the measurement terminal 12 in the region R1, the measurement terminal 12 can be affected by the first cutout portion 13a and the second cutout portion 13b provided in the base material 11. As a result, it becomes easy to make the absolute value of the temperature coefficient of resistance (TCR) be 50 ppm or less, and as a result, the temperature characteristics can be easily improved.

Thus, according to the present embodiment described above, the temperature characteristics can be improved.

The shape of the shunt resistor 1 shown in the present embodiment is merely an example, and various modifications and changes can be made within the scope of the gist of the present invention described in the claims. For example, only two of the first cutout portion 13a and the second cutout portion 13b are provided in the present embodiment, but not less than two cutout portions may be provided. At this time, the cutout portions are preferably formed so that the depth gradually increases as the distance from the resistive body 10 increases.

The width W1 of the first cutout portion 13a and the width W2 of the second cutout portion 13b shown in the present embodiment may be any value but are preferably the same value as the thickness of the base material 11. By doing so, it becomes favorable to form the cutout portions by press working, and as a result, it becomes possible to respond to mass productivity.

Further, the distance t between the first cutout portion 13a and the second cutout portion 13b shown in the present embodiment may be any value but is preferably the same value as the thickness of the base material 11. Further, by doing so, it becomes more favorable to form the cutout portions by press working, and as a result, it becomes possible to respond to higher mass productivity.

Further, as the shape of the first cutout portion 13a and the second cutout portion 13b, an example of the rectangular shape in plan view is shown in the present embodiment. However, without being limited thereto, the first cutout portion 13a and the second cutout portion 13b may have any shape.

EXAMPLES

Next, the present invention will be described in more detail using examples.

Figure 2:
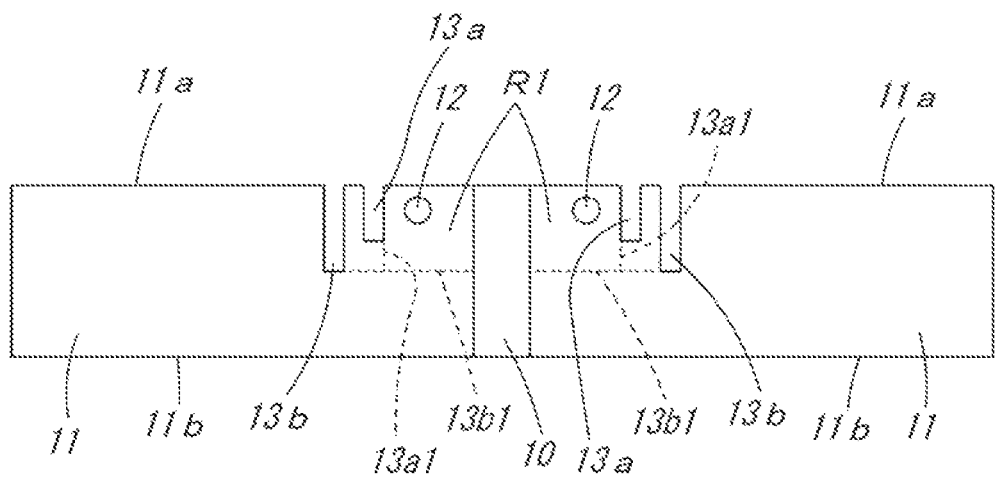
FIG. 2(a) is a plan view when measurement terminals of the shunt resistor according to the same embodiment are provided on an upper surface side.
FIG. 2(b) is a plan view when the measurement terminals of the shunt resistor according to the same embodiment are provided on a lower surface side.
Figure 2:
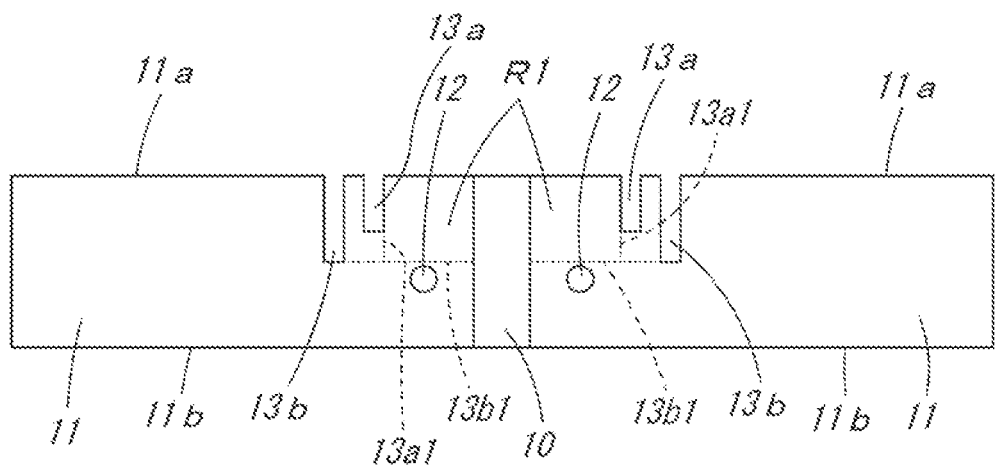

10 pieces of shunt resistors 1 shown in FIG. 2 were used to measure the resistance value by changing the temperature. As shown in FIG. 2, the base materials 11 were each provided with a first cutout portion 13a having a width of 2 mm (see the width W1 shown in FIG. 1) and a depth of 4 mm (see the depth D1 shown in FIG. 1) and a second cutout portion 13b having a width of 2 mm (see the width W2 shown in FIG. 1) and a depth of 6 mm (see the depth D2 shown in FIG. 1) with a space of 2 mm (see the distance t shown in FIG. 1) in a direction away from the resistive body 10 relative to the first cutout portion 13a. As shown in FIG. 2(a), the measurement terminals 12 were arranged on an upper side of the regions R1 (upper surface 11a side of the base materials 11).

Such shunt resistors 1 were each placed on a resistance measuring jig manufactured by SUNCALL CORPORATION, and the resistance value was measured by changing the temperature, using a resistance measuring instrument, RM3543 RESISTANCE HiTESTER, manufactured by HIOKI E.E. CORPORATION. The results are shown in Table 1. The value of the temperature coefficient of resistance (TCR) shown below was calculated using a general formula from the rate of change in resistance value and the temperature difference from the reference temperature of 25° C.

TABLE 1

| Temperature (° C.) | Average resistance value of 10 pieces (mΩ) | Rate of change relative to 25° C. (%) |
| --- | --- | --- |
| 25 | 0.043734 | 0 |
| 30 | 0.043674 | −0.00137 |
| 40 | 0.043485 | −0.00569 |
| 50 | 0.04329 | −0.01015 |
| 60 | 0.043088 | −0.01477 |
| 70 | 0.042896 | −0.01916 |
| 80 | 0.042694 | −0.02378 |
| 90 | 0.04251 | −0.02799 |
| 100 | 0.04237 | −0.03119 |

* Temperature coefficient of resistance (TCR): −421.5 ppm

As shown in the results of Table 1 above, since the temperature coefficient of resistance (TCR) is −421.5 ppm, the absolute value of the temperature coefficient of resistance (TCR) is not 50 ppm or less. This does not satisfy the market demand. Thus, the measurement terminals 12 were arranged on the lower surface 11b side of the base materials 11 by about 3 mm from the positions shown in FIG. 2(a), and the resistance value was measured again. The results are shown in Table 2.

TABLE 2

| Temperature (° C.) | Average resistance value of 10 pieces (mΩ) | Rate of change relative to 25° C. (%) |
| --- | --- | --- |
| 25 | 0.048968 | 0 |
| 30 | 0.048965 | −6.1E−0.5 |
| 40 | 0.048959 | −0.000018 |
| 50 | 0.048941 | −0.000055 |
| 60 | 0.049032 | 0.001307 |
| 70 | 0.049 | 0.000653 |
| 80 | 0.049038 | 0.00143 |
| 90 | 0.048992 | 0.00049 |
| 100 | 0.04906 | 0.001879 |

* Temperature coefficient of resistance (TCR): 25.3 ppm

As shown in the results of Table 2 above, since the temperature coefficient of resistance (TCR) is 25.3 ppm, the absolute value of the temperature coefficient of resistance (TCR) is 50 ppm or less. This satisfies the market demand.

Next, as shown in FIG. 2(b), the measurement terminals 12 were arranged on the lower surface 11b side of the base materials 11 so as to be outside of the regions R1, and the resistance value was measured again. The results are shown in Table 3.

TABLE 3

| Temperature (° C.) | Average resistance value of 10 pieces (mΩ) | Rate of change relative to 25° C. (%) |
| --- | --- | --- |
| 25 | 0.05299 | 0 |
| 30 | 0.053043 | 0.001 |
| 40 | 0.05317 | 0.003397 |
| 50 | 0.053295 | 0.005756 |
| 60 | 0.053411 | 0.007945 |
| 70 | 0.053521 | 0.010021 |
| 80 | 0.053628 | 0.01204 |
| 90 | 0.053734 | 0.01404 |
| 100 | 0.053821 | 0.015682 |

* Temperature coefficient of resistance (TCR): 211.9 ppm

As shown in the results of Table 3 above, since the temperature coefficient of resistance (TCR) is 211.9 ppm, the absolute value of the temperature coefficient of resistance (TCR) is not 50 ppm or less. This does not satisfy the market demand.

Thus, from the above experimental results, it was found that if the measurement terminals 12 are configured to be arranged in the regions R1, the absolute value of the temperature coefficient of resistance (TCR) is easily adjusted to 50 ppm or less.

Next, the following experiment was conducted in order to verify the effect of providing the first cutout portions 13a and the second cutout portions 13b in the base materials 11.

First, 10 pieces of shunt resistors in which the first cutout portions 13a and the second cutout portions 13b were not formed in the base materials 11 as shown in FIG. 3 and the measurement terminals 12 were arranged on the upper surface 11a side of the base materials 11 as shown in FIG. 3(a) were each placed on the resistance measuring jig manufactured by SUNCALL CORPORATION, and the resistance value was measured by changing the temperature, using the resistance measuring instrument, RM3543 RESISTANCE HiTESTER, manufactured by HIOKI E.E. CORPORATION. The results are shown in Table 4.

TABLE 4

| Temperature (° C.) | Average resistance value of 10 pieces (mΩ) | Rate of change relative to 25° C. (%) |
|---|---|---|
| 25 | 0.043734 | 0 |
| 30 | 0.043674 | −0.00137 |
| 40 | 0.043485 | −0.00569 |
| 50 | 0.04329 | −0.01015 |
| 60 | 0.043088 | −0.01477 |
| 70 | 0.042896 | −0.01916 |
| 80 | 0.042694 | −0.02378 |
| 90 | 0.04251 | −0.02799 |
| 100 | 0.04237 | −0.03119 |

* Temperature coefficient of resistance (TCR): −421.467 ppm

As shown in the results of Table 4 above, since the temperature coefficient of resistance (TCR) is −421.467 ppm, the absolute value of the temperature coefficient of resistance (TCR) is not 50 ppm or less. This does not satisfy the market demand. Next, the measurement terminals 12 were arranged on the lower surface 11b side of the base materials 11 as shown in FIG. 3(b), and the resistance value was measured again. The results are shown in Table 5.

TABLE 5

| Temperature (° C.) | Average resistance value of 10 pieces (mΩ) | Rate of change relative to 25° C. (%) |
|---|---|---|
| 25 | 0.05172 | 0 |
| 30 | 0.051730 | 0.000174 |
| 40 | 0.051783 | 0.1199 |
| 50 | 0.051818 | 0.1875 |
| 60 | 0.051863 | 0.2745 |
| 70 | 0.051897 | 0.3403 |
| 80 | 0.051945 | 0.4331 |
| 90 | 0.051986 | 0.5124 |
| 100 | 0.052036 | 0.6090 |

* Temperature coefficient of resistance (TCR): 81.20493 ppm

As shown in the results of Table 5 above, since the temperature coefficient of resistance (TCR) is 81.20493 ppm, the absolute value of the temperature coefficient of resistance (TCR) is not 50 ppm or less. This also does not satisfy the market demand.

Thus, as for the shunt resistor in which the first cutout portions 13a and the second cutout portions 13b are not formed in the base materials 11, it was found that the absolute value of the temperature coefficient of resistance (TCR) cannot be made to 50 ppm or less simply by changing the positions of the measurement terminals 12.

Figure 4:
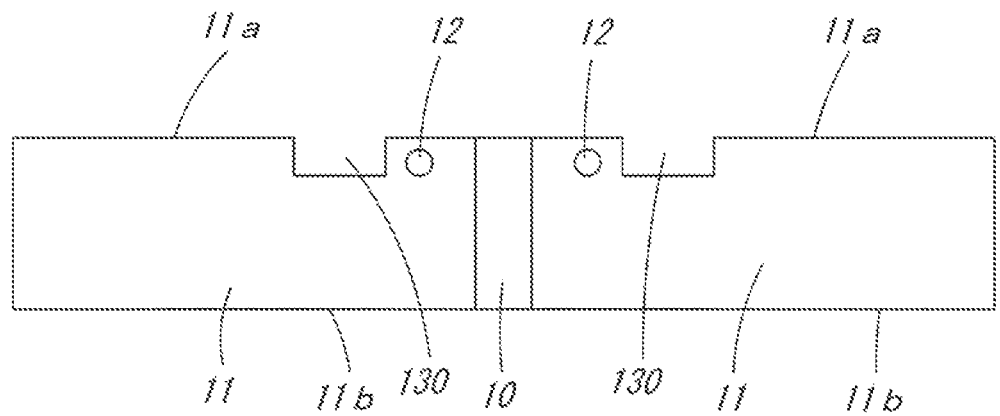
FIG. 4(a) is a plan view of the shunt resistor according to the same embodiment in which the base materials are each provided with only one cutout portion, when the measurement terminals of the shunt resistor are provided on the upper surface side.
FIG. 4(b) is a plan view when the measurement terminals of the shunt resistor are provided on the lower surface side.
Figure 4:
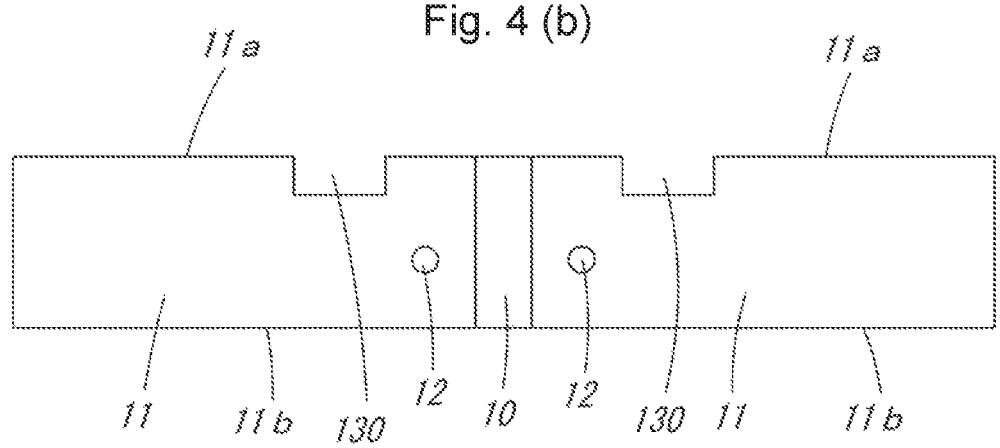

Next, 10 pieces of shunt resistors in which the base materials 11 were each provided with a cutout portion 130 having a width of 8 mm (see the longitudinal direction side of the base material 11 shown in FIG. 4) and a depth of 4 mm (see the lateral direction side of the base material 11 shown in FIG. 4) at only one place as shown in FIG. 4 and the measurement terminals 12 were arranged on the upper surface 11a side of the base materials 11 as shown in FIG. 4(a) were each placed on the resistance measuring jig manufactured by SUNCALL CORPORATION and the resistance value was measured by changing the temperature, using the resistance measuring instrument, RM3543 RESISTANCE HiTESTER, manufactured by HIOKI E.E. CORPORATION. The results are shown in Table 6.

TABLE 6

| Temperature (° C.) | Average resistance value of 10 pieces (mΩ) | Rate of change relative to 25° C. (%) |
|---|---|---|
| 25 | 0.044927 | 0 |
| 30 | 0.044905 | −0.00049 |
| 40 | 0.044752 | −0.0039 |
| 50 | 0.044594 | −0.00741 |
| 60 | 0.044443 | −0.01077 |
| 70 | 0.044285 | −0.01429 |
| 80 | 0.04413 | −0.01774 |
| 90 | 0.044074 | −0.01899 |
| 100 | 0.043853 | −0.02391 |

* Temperature coefficient of resistance (TCR): −328.8 ppm

As shown in the results of Table 6 above, since the temperature coefficient of resistance (TCR) is −328.8 ppm, the absolute value of the temperature coefficient of resistance (TCR) is not 50 ppm or less. This does not satisfy the market demand. Next, the measurement terminals 12 were arranged on the lower surface 11b side of the base materials 11 as shown in FIG. 4(b), and the resistance value was measured again. The results are shown in Table 7.

TABLE 7

| Temperature (° C.) | Average resistance value of 10 pieces (mΩ) | Rate of change relative to 25° C. (%) |
|---|---|---|
| 25 | 0.051853 | 0 |
| 30 | 0.051886 | −0.00016 |
| 40 | 0.051975 | 0.000286 |
| 50 | 0.052069 | −0.00035 |
| 60 | 0.052148 | −0.00014 |
| 70 | 0.052232 | −0.0039 |
| 80 | 0.052309 | −0.00041 |
| 90 | 0.052384 | −0.00027 |
| 100 | 0.052443 | −0.00137 |

* Temperature coefficient of resistance (TCR): 157.6 ppm

As shown in the results of Table 7 above, since the temperature coefficient of resistance (TCR) is 157.6 ppm, the absolute value of the temperature coefficient of resistance (TCR) is not 50 ppm or less. This does not satisfy the market demand.

Thus, as for the shunt resistor in which only one cutout portion is formed in the base materials 11 each, it was found that the absolute value of the temperature coefficient of resistance (TCR) cannot be made to 50 ppm or less even if the positions of the measurement terminals 12 are changed.

Therefore, it was found that the absolute value of the temperature coefficient of resistance (TCR) cannot be made to 50 ppm or less even if the positions of the measurement terminals 12 are changed unless the first cutout portions 13a and the second cutout portions 13b are formed in the base materials 11.

Thus, from the above experimental results, it was found that the absolute value of the temperature coefficient of resistance (TCR) can be made to 50 ppm or less by providing the first cutout portions 13a and the second cutout portions 13b in the base materials 11.

What is claimed:

1. A shunt resistor, comprising:
   a resistive body;
   a pair of base materials integrally formed on the resistive body across the resistive body; and
   measurement terminals fixed on the base materials, and the base materials are each provided with a plurality of cutout portions at a location away from the resistive body and along a longitudinal direction of the base materials; and
   the plurality of cutout portions do not communicate with each other and are provided in a stepped manner in which a depth of the cutout portions increases as a distance from the resistive body increases.

2. The shunt resistor according to claim 1, wherein, the plurality of cutout portions includes first and second cutout portions, the second cutout portion is located farther from the resistive body than the first cutout portion, and the second cutout portion is formed so that a depth is the deepest as compared with a depth of the first cutout portion.

3. The shunt resistor according to claim 2, wherein, when fixed on the base materials, the measurement terminals are each fixed so as to be located above a bottom portion of the depth of the second cutout portion located farthest from the resistive body and also further inside than one side portion of a cutout portion located closest to the resistive body.

4. A shunt resistor, comprising:
   a resistive body;
   a pair of base materials integrally formed on the resistive body across the resistive body;
   measurement terminals fixed on the base materials, and the base materials are each provided with a plurality of cutout portions along a longitudinal direction of the base materials;
   the plurality of cutout portions do not communicate with each other and are provided in a stepped manner;
   the plurality of cutout portions including first and second cutout portions, the second cutout portion is located farther from the resistive body than the first cutout portion, and the second cutout portion is formed so that a depth is the deepest as compared with a depth of the first cutout portion; and
   when fixed on the base materials, the measurement terminals are each fixed so as to be located above a bottom portion of the depth of the second cutout portion located farthest from the resistive body and also further inside than one side portion of a cutout portion located closest to the resistive body.

5. A shunt resistor, comprising:
   a resistive body;
   a pair of base materials integrally formed on the resistive body across the resistive body; and
   measurement terminals fixed on the base materials, and the base materials are each provided with a plurality of cutout portions at a location away from the resistive body and along a longitudinal direction of the base materials;
   the plurality of cutout portions do not communicate with each other and are provided in a stepped manner; and
   the plurality of cutout portions includes first and second cutout portions, the second cutout portion is located farther from the resistive body than the first cutout portion, and the second cutout portion is formed so that a depth is the deepest as compared with a depth of the first cutout portion.

6. The shunt resistor according to claim 5, wherein, when fixed on the base materials, the measurement terminals are each fixed so as to be located above a bottom portion of the depth of the second cutout portion located farthest from the resistive body and also further inside than one side portion of a cutout portion located closest to the resistive body.

* * * * *